(12) United States Patent
Ryu et al.

(10) Patent No.: US 7,033,915 B2
(45) Date of Patent: Apr. 25, 2006

(54) METHOD FOR CRYSTALLIZING AMORPHOUS SILICON FILM

(75) Inventors: Myung Kwan Ryu, Kyoungki-do (KR); Ho Nyeon Lee, Kyoungki-do (KR); Jae Chul Park, Seoul (KR); Eok Su Kim, Seoul (KR); Kyoung Seok Son, Seoul (KR); Jun Ho Lee, Kyoungki-do (KR); Se Yeoul Kwon, Seoul (KR)

(73) Assignee: BOE Hydis Technology Co., Ltd., Kyoungki-do (KR)

( * ) Notice: Subject to any disclaimer, the term of this patent is extended or adjusted under 35 U.S.C. 154(b) by 29 days.

(21) Appl. No.: 10/881,257

(22) Filed: Jun. 30, 2004

(65) Prior Publication Data
US 2005/0112809 A1 May 26, 2005

(30) Foreign Application Priority Data
Nov. 26, 2003 (KR) .................. 10-2003-0084317

(51) Int. Cl.
*H01L 21/20* (2006.01)

(52) U.S. Cl. .................. 438/487; 438/482; 438/486
(58) Field of Classification Search .......... 438/482, 438/486, 487, 166; 117/44; 257/E21.133
See application file for complete search history.

(56) References Cited

U.S. PATENT DOCUMENTS

| 6,322,625 | B1* | 11/2001 | Im .......................... 117/43 |
| 6,555,449 | B1* | 4/2003 | Im et al. ................ 438/487 |
| 6,653,179 | B1* | 11/2003 | Minegishi et al. ...... 438/166 |
| 6,660,576 | B1* | 12/2003 | Voutsas et al. ......... 438/166 |
| 6,755,909 | B1* | 6/2004 | Jung ........................ 117/4 |
| 2002/0058399 | A1* | 5/2002 | Sato et al. ............. 438/486 |

* cited by examiner

*Primary Examiner*—Zandra V. Smith
*Assistant Examiner*—Bac H. Au
(74) *Attorney, Agent, or Firm*—Ladas & Parry LLP

(57) ABSTRACT

Disclosed is a method for crystallizing a single crystalline Si film on an amorphous substrate, such as a glass substrate or a plastic substrate. The method includes the steps of selectively irradiating the laser beam onto a pixel section TFT forming region and a peripheral circuit TFT forming region of the amorphous silicon film through primary and secondary laser irradiation processes, thereby forming a poly-silicon film and irradiating the laser beam onto one of grains formed in the poly-silicon film through a third laser irradiation process, thereby forming a single crystalline silicon region having a desired size on a predetermined portion of the amorphous silicon film. The amorphous silicon film is locally crystallized into the single crystalline silicon film so that characteristics of TFTs for the pixel section and the peripheral circuit are improved while ensuring high uniformity.

12 Claims, 15 Drawing Sheets

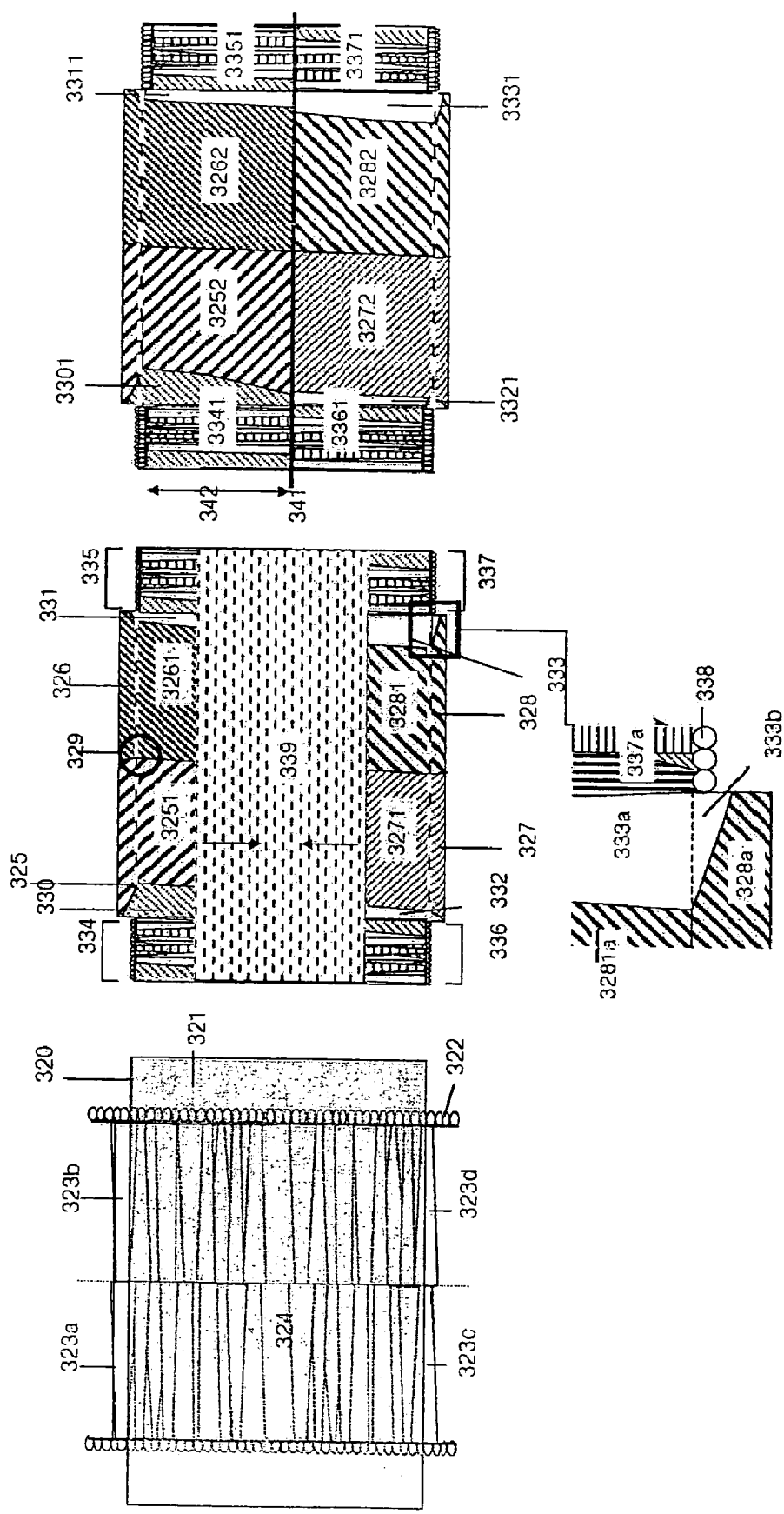

METHOD FOR CRYSTALLIZING AMORPHOUS SILICON FILM

BACKGROUND OF THE INVENTION

1. Field of the Invention

The present invention relates to a method for manufacturing a liquid crystal display, and more particularly to a method for crystallizing an amorphous silicon film in order to form a single crystalline silicon film having high uniformity and a superior device function.

2. Description of the Prior Art

Generally, a TFT (thin film transistor), which is a switching device used for a liquid crystal display or an organic light emitting display made from an organic electroluminescent material, is the most important component for achieving superior performance of flat panel displays.

Herein, mobility or leakage current of the TFT, which is a basis for judging performance of the TFT, may seriously relate to a state or a structure of a silicon film used as a material for an active layer providing a passage for an electric charge carrier. In a case of liquid crystal displays available from markets, most of active layers of the TFT are made from an a-Si (amorphous silicon) film.

However, an a-Si TFT employing an a-Si film as an active layer has low mobility of about 0.5 $cm^2/V_s$, so problems may occur if all switching devices provided in the liquid crystal display are made from the a-Si TFT. That is, a driving device for a peripheral circuit of the liquid crystal display must be operated with a high speed. However, the a-Si TFT cannot satisfy a driving speed required by a peripheral circuit driving device, which means that the a-Si TFT is not adaptable for fabricating the peripheral circuit driving device.

Accordingly, when manufacturing the liquid crystal display, peripheral circuit driving parts, such as a driving circuit, various controllers, and a digital-analog converter, are integrated on a single crystalline silicon film in the form of devices in order to respond to a high driving speed required for driving the liquid crystal display. Also, the a-Si TFT has a switching function and a low leakage current characteristic, which are essentially required for ensuring superior image quality, so that the a-Si TFT is used as a pixel switching device.

Meanwhile, a poly-Si (poly silicon) TFT including a poly-Si film as an active layer has high mobility in a range of few tens $cm^2/V_s$ to few hundreds $cm^2/V_s$, so the poly-Si TFT may be operated with a high driving speed corresponding to the peripheral circuit driving device. For this reason, if the poly-Si film is formed on a glass substrate, the peripheral circuit driving parts and the pixel switching device can be easily formed. Accordingly, an additional module forming process for forming peripheral circuits is not necessary. In addition, peripheral circuit driving parts may be formed while forming a pixel region, so a manufacturing cost for the peripheral circuit driving parts can be reduced.

Also, since the poly-Si TFT has high mobility, the poly-Si TFT can be manufactured with a compact size smaller than a size of the a-Si TFT. In addition, the driving device for the peripheral circuit and the switching device for the pixel region can be simultaneously formed through an integration process so that a micro design rule may be easily achieved. Therefore, the poly-Si TFT is very advantageous for achieving high resolution, which cannot be achieved by using the a-Si TFT LCD.

In addition, since the poly-Si TFT has a high current characteristic, the poly-Si TFT is adaptable for a driving device of an organic light emitting display, which is a next generation flat panel display. Recently, a study for manufacturing the TFT by forming the poly-Si film on the glass substrate and a study for applying the poly-Si TFT to the organic light emitting display have been actively researched.

For example, after depositing the a-Si film on the glass substrate, a predetermined heat treatment process is carried out with respect to the a-Si film such that the a-Si film is crystallized, thereby forming the poly-Si film on the glass substrate. In this case, the glass substrate may be deformed at a high temperature above 600° C., so a yield rate and reliability of articles are decreased.

Therefore, an ELA (excimer laser annealing) process capable of crystallizing only the a-Si film without causing thermal damage to the glass substrate is used as a crystallizing method for the a-Si film.

According to the ELA process, the a-Si film is melted through a laser irradiation process, and then, the melted a-Si film is crystallized while being solidified. While the a-Si film is being crystallized, grains are grown from crystal nuclei, which are randomly created while the a-Si film is being melted and solidified. At this time, the grains may be formed with various sizes in a range of few tens nm to few μm according to a laser irradiation condition.

FIG. 1a shows plan and sectional views for explaining a conventional ELA process, and FIG. 1b is a photographic view showing a microstructure of poly-Si achieved through the ELA process.

According to the ELA process, as shown in FIG. 1a, an excimer laser 13a irradiates onto an entire surface of an a-Si film 11 deposited on a glass substrate 10 with a thickness of about 100 to 2,000 Å according to a predetermined scan manner. At this time, a predetermined region of the a-Si film 11 receiving the excimer laser 13 is crystallized, so a poly-Si film 12 is formed. A buffer layer 14 is interposed between the glass substrate 10 and the a-Si film 11 in order to prevent a device characteristic from being lowered due to impurities derived from the glass substrate 10 while the excimer laser 13 is being irradiated onto the a-Si film 11.

The a-Si film 11, onto which the excimer laser 13 is irradiated, is partially melted or completely melted according to energy values of the excimer laser 13. A microstructure of the poly-Si film 12 achieved by crystallizing the a-Si film 11 is shown in FIG. 1b.

Herein, a size of a grain existing in the poly-Si film 12 becomes enlarged as energy of the excimer laser increases if the a-Si film 11 has not been completely melted. Also, after the size of the grain in the poly-Si film 11 has become a maximum size, the size of the grain existing in the poly-Si film 12 becomes reduced if the a-Si film 11 is completely melted. Even though it is necessary for achieving the superior device characteristic to reduce crystalline faults, such as a grain boundary, if the size of the grain becomes enlarged, distribution uniformity for the grains may be deteriorated, so uniformity of the device characteristic is also deteriorated, thereby decreasing a yield rate and reliability of articles.

Accordingly, even though the superior device characteristic is an important factor for allowing the poly-Si TFTs to be manufactured in mass-production, a uniformity degree of the device characteristic must be ensured together with the superior device characteristic. Accordingly, when the poly-Si film crystallized through the ELA process is applied to articles, the poly-Si film having the grain of a limited size must be used for ensuring uniformity of the device characteristic.

However, in this case, the poly-Si TFT has inferior mobility due to the limited size of the grain. In addition, integration for peripheral circuits may be limited, so it is difficult to realize an SOG (silicon on glass) structure through the ELA process.

In addition, the ELA process has a limitation in view of the device characteristic, and has following limitations with regard to the process.

According to the ELA process, laser irradiation energy is unevenly formed in each shot. In addition, since about 20 to 30 μm of a profile section causing laser energy to decrease may exist around a laser beam having a size of about 300 to 400 μm, an overlapped ratio per one shot is maintained above 90 percent in order to ensure superior uniformity. For this reason, the laser beam repeatedly irradiates onto the same region by at least 10 times in order to completely crystallize the region, so the ELA process has a disadvantage in view of process efficiency and manufacturing costs.

Meanwhile, U.S. Pat. Nos. 6,322,625 and 6,368,945 (issued to James Im et., al) disclose a crystallizing method capable of ensuring a grain having a large size, high productivity and high uniformity. As shown in FIG. 2a, according to a method called an "SLS (Sequential Lateral Solidification)", a predetermined mask 25 is aligned between a laser beam 23 and an a-Si film 21 so as to convert the laser beam into a required shape, thereby crystallizing the a-Si film 21. In a practical process, a predetermined optical system 25a is aligned between the mask 25 and the a-Si film 21, so that the laser beam 23 passing through the mask 25 is irradiated onto the a-Si film 21 while a size of the laser 23 is being reduced with a predetermined scale. In FIG. 2a, reference number 20 represents a glass substrate, and reference number 24 represents a buffer layer, respectively.

A two-shot SLS process is provided as a solution for realizing an SLS concept. FIG. 2b is a plan view showing a mask employed for the two-shot SLS process. As shown in FIG. 2b, the mask 25 for the two-shot SLS process includes slit arrays of two rows, which are aligned offset from each other.

According to the two-shot SLS process, a laser beam is primarily irradiated through a slit pattern 26, which is an open region formed in the mask 25 shown in FIG. 2b. In this case, as shown in FIG. 2c, a slit pattern region including a plurality of slits and formed in an a-Si film corresponding to the slit pattern 26 is crystallized. At this time, a crystallization process is carried out over the whole area of the slit pattern region by grains grown from edge sections of each slit of the slit pattern region to the center portion of each slit. Also, when grains grown from both edge sections of the slit make contact with each other at the center portion of the slit, the crystallization process has been finished. As a result, protrusions 210 are created at a center portion of a crystallization region due to collision between grains.

Meanwhile, such a phenomenon may be realized by allowing the slit to have a width of about 3 to 5 μm in such a manner that the grains grown from the edge sections of the slit can make contact with each other at the center portion of the slit, before spontaneous nucleation is generated at the center portion of the slit caused by solidification of silicon, which has been melted by the laser irradiation process. If the width of the slit is too wide, poly-Si is created around the center portion of the slit due to nucleation before the grains grown from one edge of each slit make contact with grains grown from the other edge of each slit at the center portion of each slit. Accordingly, the crystallization characteristic of the a-Si film is deteriorated, so the device characteristic and the degree of uniformity are lowered.

Hereinafter, a crystallization status of the a-Si film after the primarily laser irradiation has been carried out will be described. As is understood from a figure provided in a lower part of FIG. 2c, a lateral growth length Lg of the grain is a half of a width W of each slit provided in the slit pattern region, and crystallized regions are created. At this time, the protrusions 210 are constantly aligned with a predetermined interval Sp1. Each crystallized region includes a micro grain region 212 formed at a start point of the crystallization and grains 220 having long lengths extending to the protrusions 210. That is, after the primary laser irradiation has been carried out, a slit array pattern corresponding to a slit array formed in the mask 25 is formed in the crystallized region. Also, an interval between crystallized regions in the form of the slit array pattern is substantially identical to an interval d1 formed between slits of the slit pattern region formed in the a-Si film 21, which are partially crystallized.

Since a non-crystallized a-Si region may exist after the primary laser irradiation process has been carried out, a secondary laser irradiation process is carried out through the slit pattern 26 formed in the mask 25 shown in FIG. 2b in order to entirely crystallize the a-Si film. At this time, the secondary laser irradiation process is carried out by irradiating the laser beam onto the a-Si film after moving the substrate by a predetermined distance from the crystallized region formed through the primarily laser irradiation process. The moving distance for the substrate is identical to or less than a slit length L. Referring to FIG. 2b, the mask 25 has slit arrays of two rows, which are aligned offset from each other, so a secondary laser irradiation region may include an overlapped part of the non-crystallized region and the crystallized region formed through the primary laser irradiation process.

FIG. 2d is a view for explaining a crystallization status of the a-Si film after the secondary laser irradiation process has been carried out. A region melted during the secondary laser irradiation process, that is, the region formed between reference number 216a and reference number 216b, includes the non-crystallized region and a part of the crystallized region formed through the primary laser irradiation process. Reference numbers 216, 216a, and 216b represent a liquid-phase Si region melted through the secondary laser irradiation process and the remaining poly-Si region, that is, the region formed between reference number 216 and reference number 216b, which is crystallized through the primary laser irradiation process and still exists without being melted through the secondary laser irradiation process. Accordingly, after the secondary laser irradiation process has been carried out, grains may grow from a boundary formed between the liquid-phase Si region and the remaining poly-Si region into the melted region by utilizing seed grains, which have been formed when the primary laser irradiation process is carried out. If seed grains formed at both edge sections of the slit grow and make contact with each other at the center portion of the slit, the crystallization process has been finished. At this time, protrusions 217 and 217a are newly created in the same manner as the primary laser irradiation process.

FIG. 2e is a photographic view showing a microstructure in a poly-Si film achieved through the crystallization process after the two-shot SLS process has been carried out.

Such a two-shot SLS process may crystallize a predetermined region by irradiating the laser beam by two times. In addition, such a process can be repeatedly performed while moving a stage of SLS equipment, on which a substrate is placed, thereby crystallizing the a-Si film formed on the entire surface of the substrate.

The two-shot SLS process is able to rapidly crystallize a broad region regardless of a size of the substrate, and has a wide process window. In addition, the two-shot SLS process can fabricate grains having a size larger than a size of grains fabricated through the above-mentioned ELA process and can control the microstructure of the crystallized poly-Si film.

However, since the poly-Si film achieved through the two-shot SLS process is not a single crystalline Si film, it has a limitation for improving the characteristics of a TFT. In addition, an uniform alignment of the poly-Si grains aligned in a row may cause a disadvantage if the alignment of the poly-Si film and the single crystalline Si film does not match with a pixel alignment and a peripheral circuit alignment formed on a glass substrate.

In addition, the two-shot SLS process may cause a minute difference between crystallized parts depending on energy fluctuation per a laser shot. Thus, the microstructures between protrusions are slightly different from each other, resulting inferior uniformity.

As a result, the poly-Si film achieved through the two-shot SLS process has limitations for achieving a superior device characteristic adaptable for an SOG structure. In addition, since the TFTs for a crystallized region, a pixel section and a peripheral circuit must be aligned in match with each other, a design scheme for the poly-Si film may be limited.

SUMMARY OF THE INVENTION

Therefore, the present invention has been made in view of the above-mentioned problems, and it is an object of the present invention to provide a method for crystallizing a-Si film in order to ensure a superior device function and uniformity.

In order to accomplish the above object, there is provided a method for crystallizing an amorphous silicon film formed on an amorphous substrate in order to fabricate a liquid crystal display by irradiating laser beam onto the amorphous silicon film from a laser source, the method comprising the steps of: selectively irradiating the laser beam onto a pixel section TFT forming region and a peripheral circuit TFT forming region of the amorphous silicon film through primary and secondary laser irradiation processes, thereby forming a poly-silicon film; and irradiating the laser beam onto one of grains formed in the poly-silicon film through a third laser irradiation process, thereby forming a single crystalline silicon region having a desired size on a predetermined portion of the amorphous silicon film.

According to the preferred embodiment of the present invention, the laser source is one selected from the group consisting of an excimer laser, a solid-state laser, a halogen lamp and a CW laser.

The primary to third laser irradiation processes are carried out by using a mask including a slit pattern having a predetermined shape for locally irradiating the laser beam onto a predetermined part of the amorphous silicon film and an optical system for irradiating the laser beam with a reduced scale.

The primary laser irradiation process is carried out by irradiating the laser beam onto the amorphous silicon film through the slit pattern of the mask, the secondary laser irradiation process is carried out by moving a substrate or the mask, and the third laser irradiation process is carried out by further moving the substrate or the mask by a predetermined distance, thereby forming the single crystalline silicon region.

The third laser irradiation process is selectively carried out with respect to one of grains formed in an overlapped region after the primary and secondary laser irradiation processes have been carried out.

The third laser irradiation process is carried out by using a mask capable of forming a masking area having a size identical to or smaller than a size of a seed grain on the seed grain.

A fourth laser irradiation process is carried out after the third laser irradiation process has been carried out in order to enlarge a size of the single crystalline silicon region formed through the third laser irradiation process.

The mask used for the primary and secondary laser irradiation processes has slit patterns aligned while forming a predetermined angle, preferably, a right angle therebetween, and a mask used for the third laser irradiation process has a circular shaped or a polygonal shaped masking area having a size identical to or smaller than a size of a seed grain.

The fourth laser irradiation process is carried out by using a mask including a circular shaped or a polygonal shaped masking area having a size identical to or smaller than a size of a single crystalline silicon region formed through the third laser irradiation process.

An additional laser irradiation process is further carried out between the primary and secondary laser irradiation processes and between secondary and third laser irradiation processes by using a mask including a slit pattern having a size identical to or narrower than a size of the slit pattern used for the primary and secondary laser irradiation processes.

An additional laser irradiation process is further carried out between the primary and secondary laser irradiation processes and between secondary and third laser irradiation processes by using a mask including a pair of slit patterns for irradiating the laser beam onto each of both edge sections of the slit pattern used for the primary and secondary laser irradiation processes.

BRIEF DESCRIPTION OF THE DRAWINGS

The foregoing and other objects, features and advantages of the present invention will become more apparent from the following detailed description in conjunction with the accompanying drawings in which:

FIGS. 4a to 4d views for explaining crystallization processes of an amorphous silicon film shown in FIGS. 3a to 3d;

DETAILED DESCRIPTION OF THE PREFERRED EMBODIMENTS

Figure 1A:
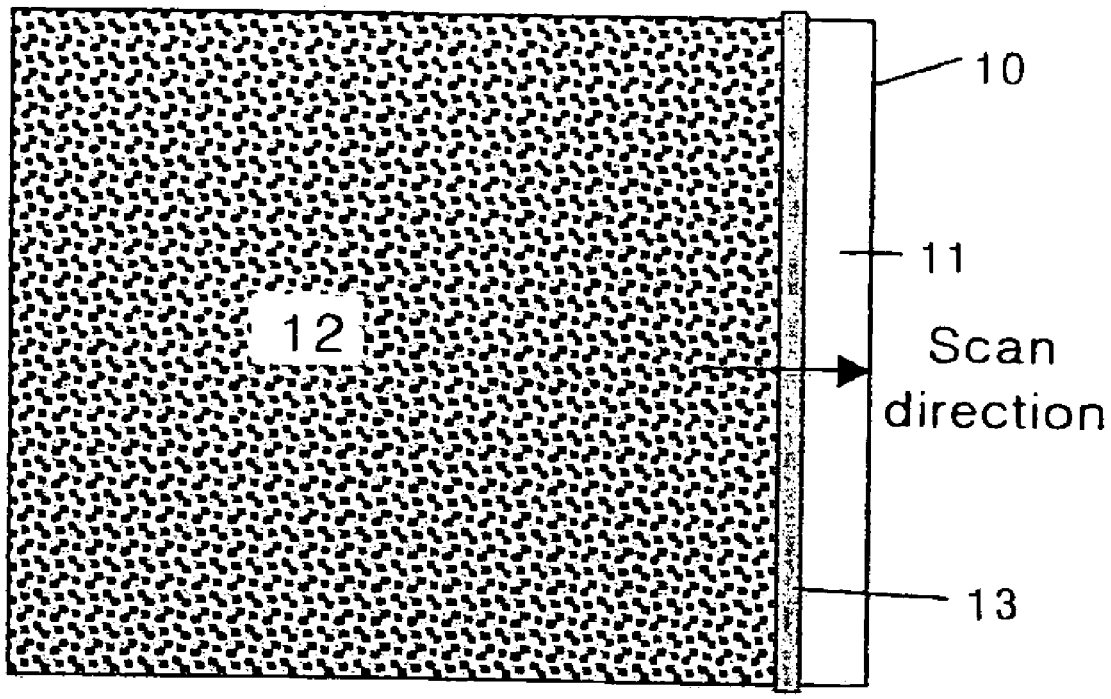
FIG. 1a shows plan and sectional views for explaining a conventional ELA process.
Figure 1A:
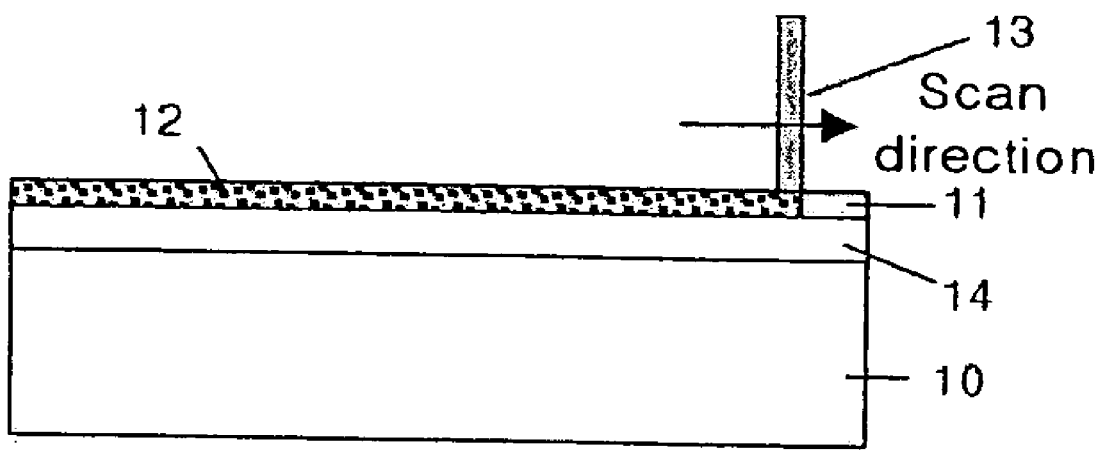
Figure 1B:
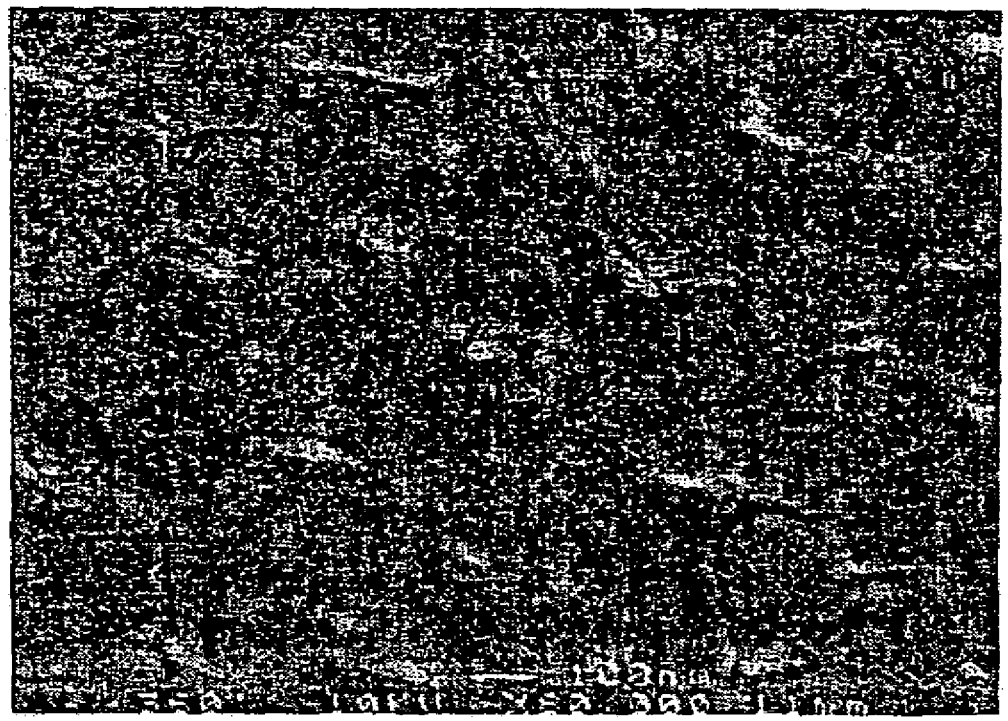
FIG. 1b is a photographic view showing a microstructure of a poly-Si film obtained through a conventional ELA process.

Reference will now be made in detail to the preferred embodiments of the present invention.

According to a conventional crystallization method used for fabricating a liquid crystal display device, a poly-Si film is obtained by crystallizing an a-Si film and a crystallization process is carried out over the whole area of a glass substrate. Therefore, the poly-Si film has inferior uniformity. In addition, the poly-Si film has a limitation for achieving superior device characteristics adaptable for an SOG (silicon-on-glass) structure. Furthermore, the conventional crystallization method has a limitation in view of a design scheme of the poly-Si film because TFTs applied to a crystallization area, a pixel section and peripheral circuits must match with each other.

In contrast, a single crystalline Si film may achieve superior device characteristics regardless of a design scheme thereof. In particular, even if the single crystalline Si film is formed only on a TFT for a pixel section, the device characteristics may be improved. In addition, if the single crystalline Si film is formed through a local crystallization method, uniformity of the single crystalline Si film may be improved.

According to the present invention, the single crystalline Si film is formed on an amorphous substrate, such as a glass substrate, a plastic substrate or an insulator, by controlling a position and a size thereof, thereby ensuring uniformity of the single crystalline Si film while improving crystallization characteristics of the single crystalline Si film.

To this end, according to the present invention, multi-laser irradiation is locally carried out with respect to an a-Si film by using a laser source, such as an excimer laser, a solid-state laser, a halogen lamp or a CW layer. Firstly, primary laser irradiation is carried out so that a primary irradiation area having a slit shape is formed on the a-Si film. Then, secondary laser irradiation is carried out so that a secondary irradiation area having a slit shape is formed on the a-Si film in such a manner that a predetermined angle is formed between the primary and secondary irradiation areas. Preferably, the secondary irradiation area perpendicularly intersects the first irradiation area. After that, third laser irradiation is carried out so that a third irradiation area having a dot shape is formed at an overlapped part of the primary and secondary irradiation areas, thereby obtaining a single crystalline area. In addition, fourth laser irradiation is carried out in order to enlarge a size of the single crystalline area.

Herein, crystallization spots for the a-Si film may be variously selected by moving a stage, on which the substrate is placed. According to the crystallization method of the present invention, the single crystalline Si film is selectively formed on the substrate by locally or selectively crystallizing the a-Si film, which is different from the conventional ELA process or the 2-shot SLS process forming the single crystalline Si film on the whole area of the substrate.

Figure 2A:
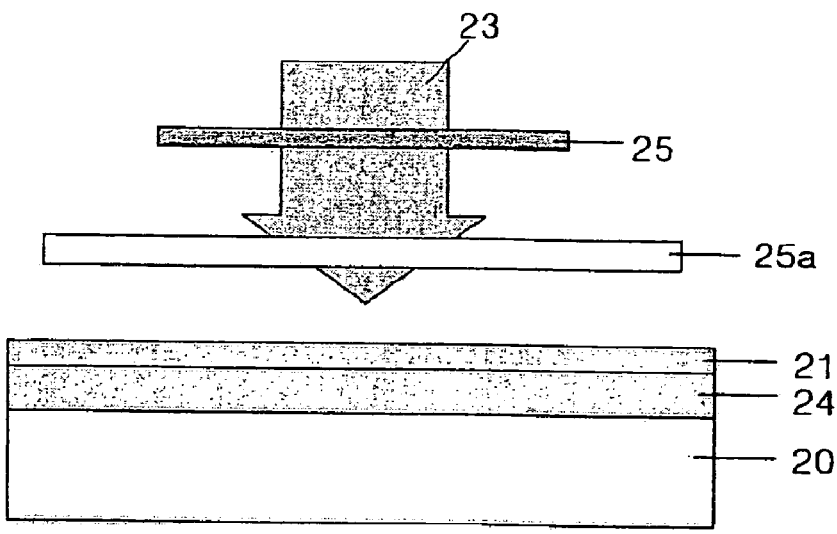
FIG. 2a is a sectional view for explaining a conventional 2-shot SLS process.
Figure 2B:
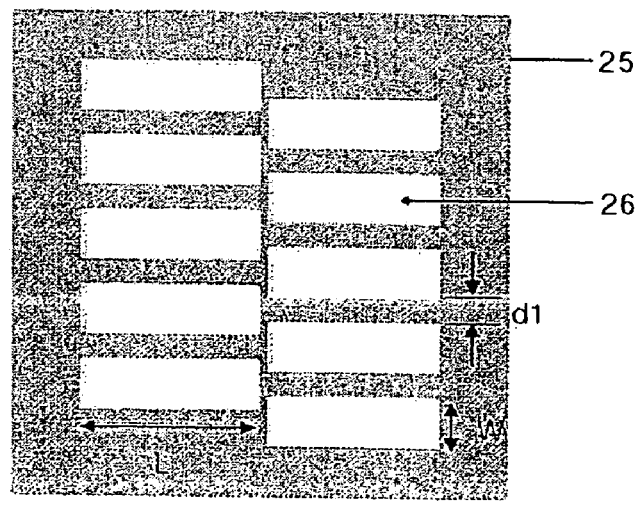
FIG. 2b is a plan view showing a mask used in a conventional 2-shot SLS process.
Figure 2C:
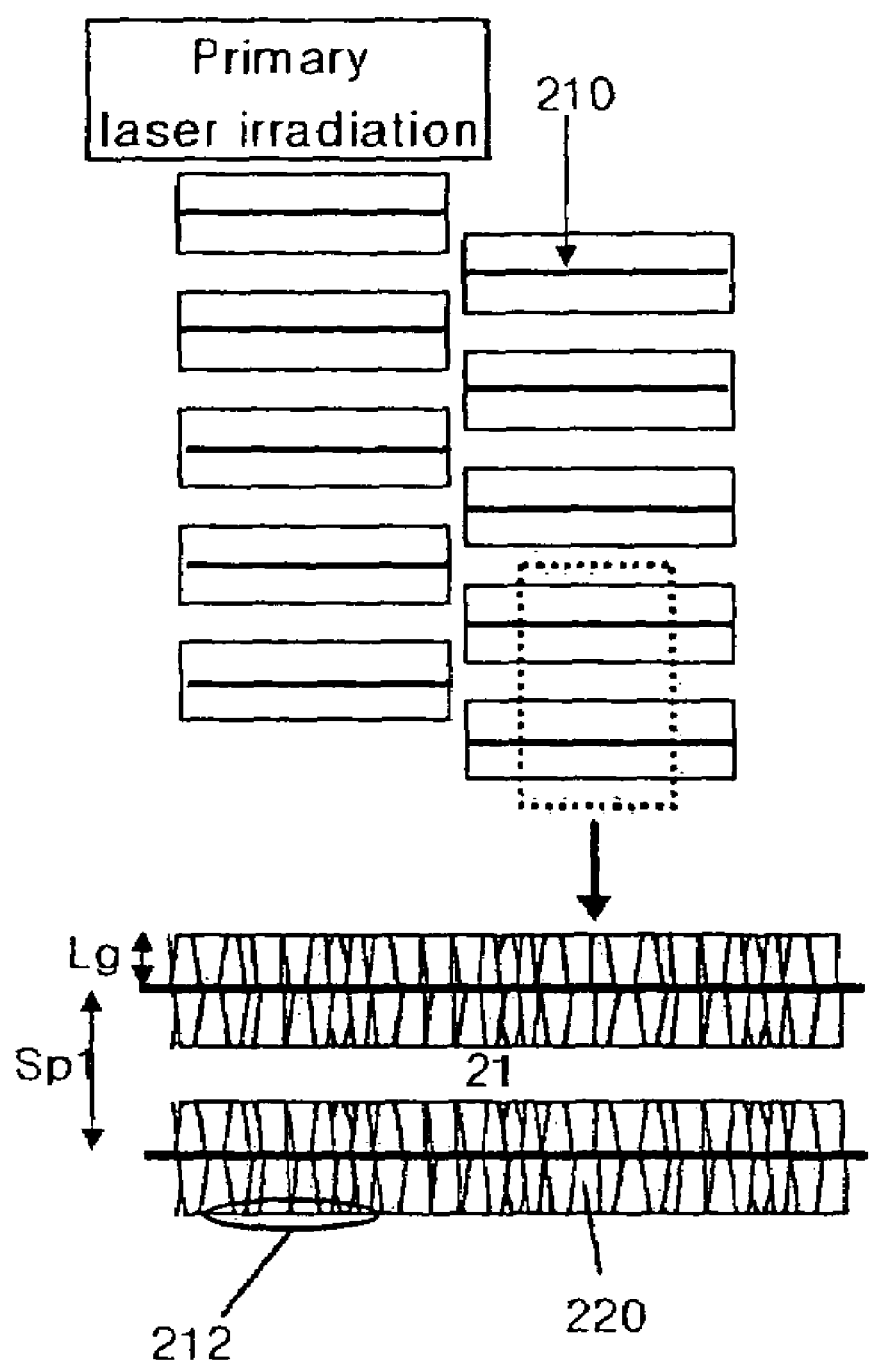
FIG. 2c is a view for explaining a crystallization status in a conventional 2-shot SLS process after primarily radiating laser.
Figure 2D:
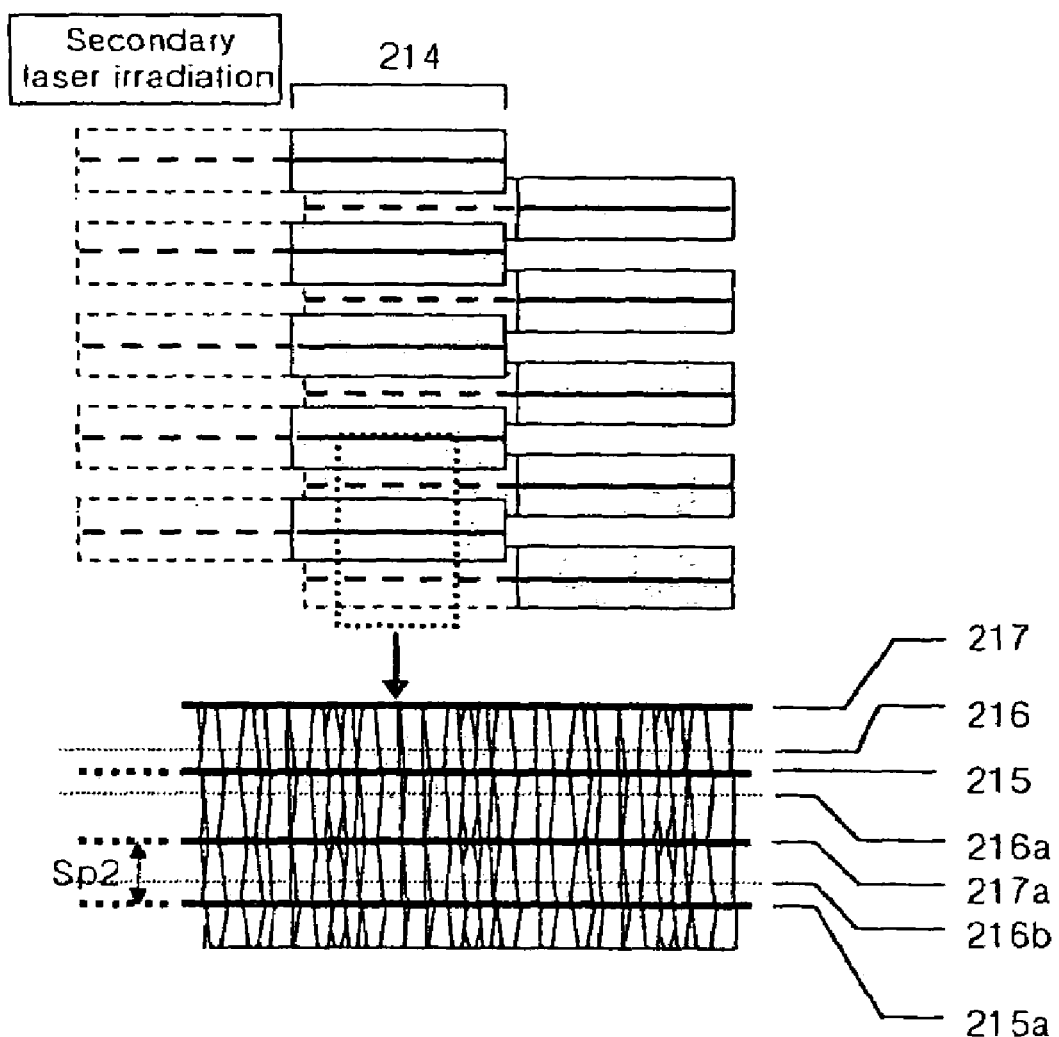
FIG. 2d is a view for explaining a crystallization status in a conventional 2-shot SLS process after secondarily radiating laser.
Figure 2E:
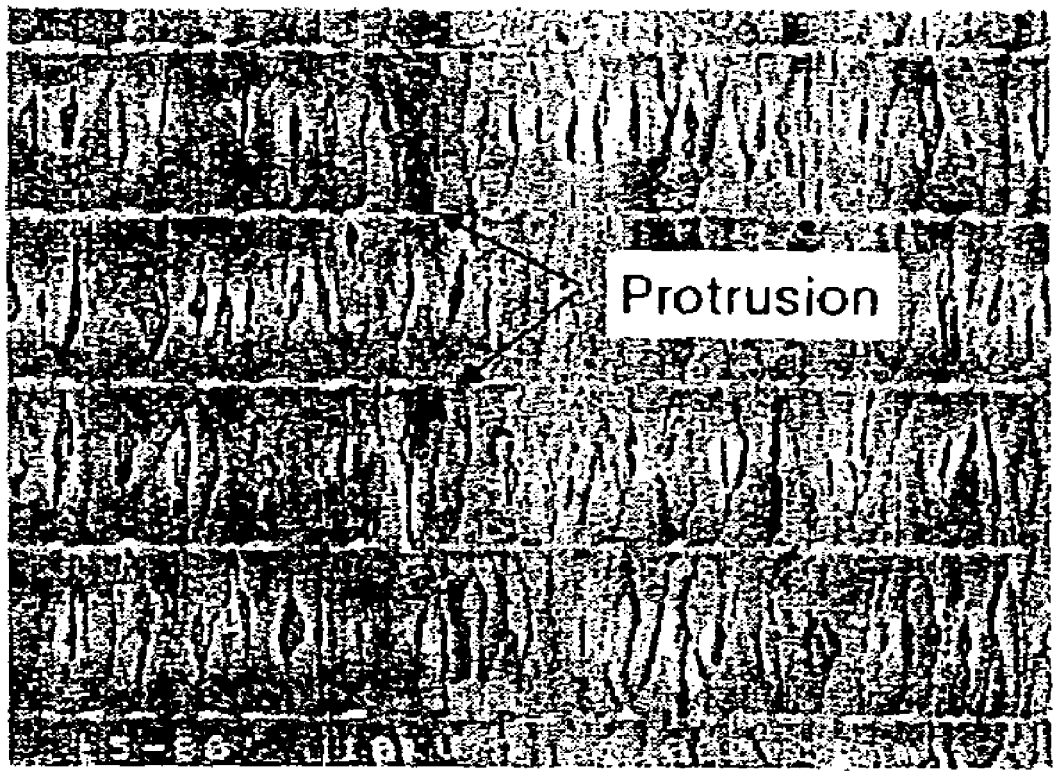
FIG. 2e is a photographic view showing a microstructure of a poly-Si film obtained through a conventional 2-shot SLS process.

Hereinafter, a method for crystallizing a-Si film according to one embodiment of the present invention will be described in detail with reference to FIGS. 3a to 3d and FIGS. 4a to 4d. An alignment for a mask, a laser source and a substrate used for performing the crystallization method of the present invention is substantially identical to the alignment of the mask, the laser source and the substrate shown in FIG. 2a. In addition, it will be understood that FIGS. 3a to 3d show a laser pattern formed on the a-Si film by the laser beam passing through the mask.

Figure 3A:
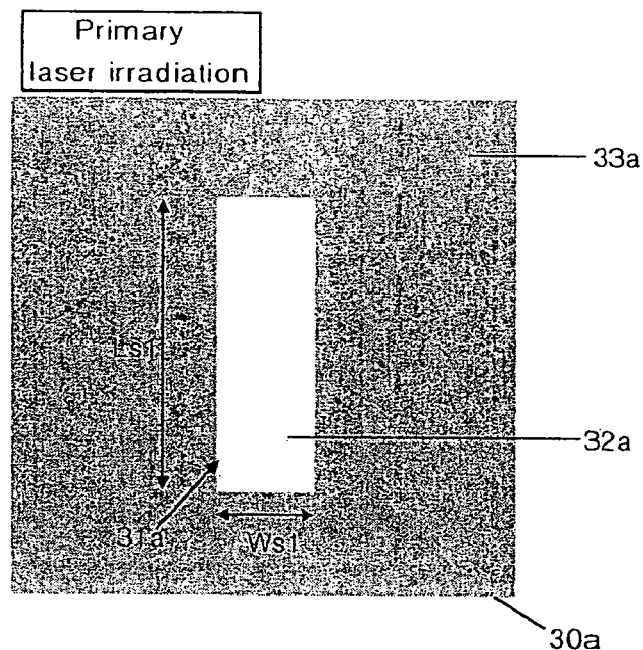
FIGS. 3a to 3d are views for explaining a method for crystallizing an amorphous silicon film according to one embodiment of the present invention.

FIG. 3a shows a laser pattern formed on the a-Si film through the primary laser irradiation. As shown in FIG. 3a, a slit pattern region 31a having predetermined length Ls1 and width Ws1 is formed in a mask pattern 30a as an open area 32a. Reference numeral 33a represents a masking area.

After the primary laser irradiation has been carried out by irradiating laser onto the a-Si film through a slit pattern of the mask in such a manner that the a-Si film is sufficiently melted, a phase of the a-Si film formed in the open area 32a is shifted into a liquid phase. Such liquid-phase Si is crystallized while being solidified. After the a-Si film has been crystallized, a microstructure is obtained as shown in FIG. 4a.

Figure 4A:
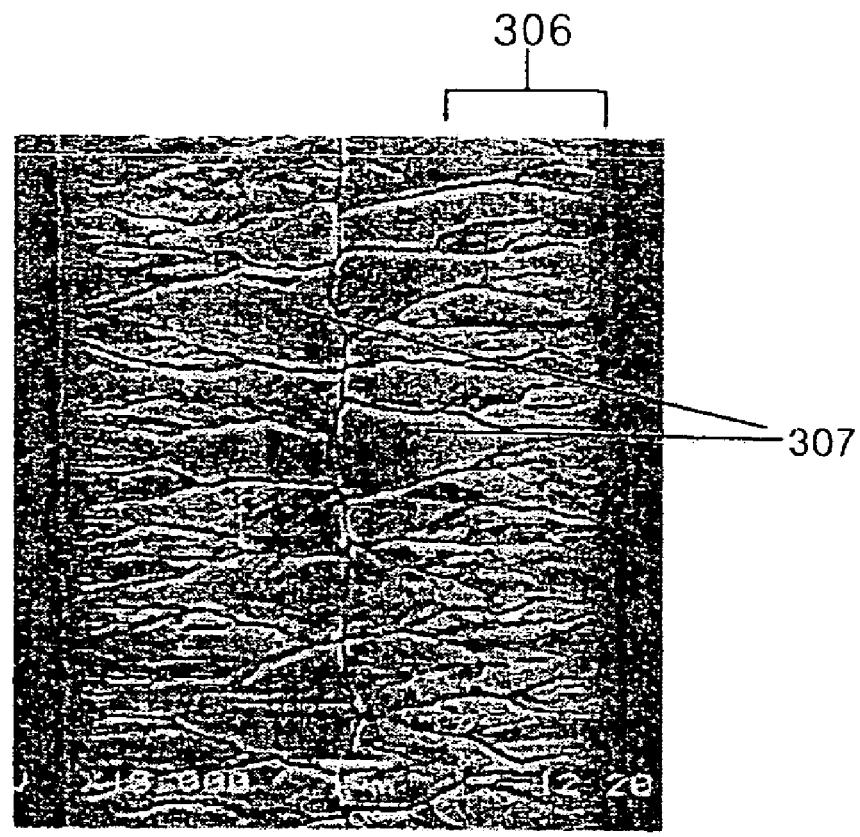
Figure 4A:
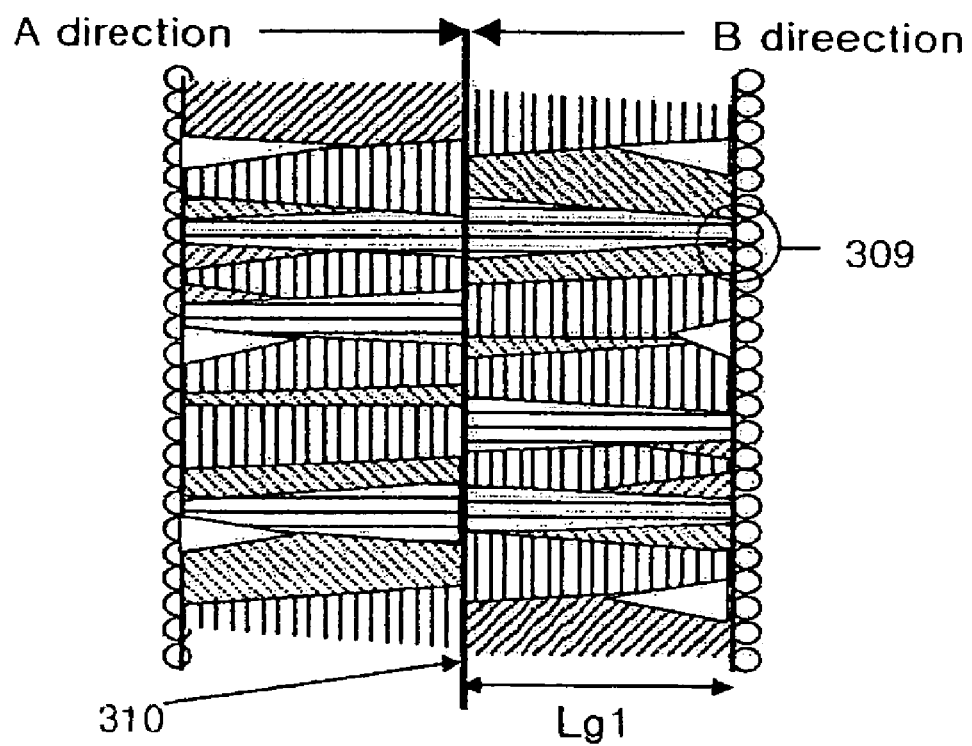

Referring to FIG. 4a, crystal nuclei are formed at edge sections of the slit pattern region 31a formed in the mask pattern 30a due to nucleation generated from the edge sections of the slit pattern region 31a. Then, the crystal nuclei are grown in A and B directions, that is, the crystal nuclei are grown toward a center of the slit pattern region 31a so that grains of the crystal nuclei derived from edge sections of the slit pattern region 31a make contact with each other at the center of the slit pattern region 31a, thereby forming protrusions 310. The grains created in nucleation areas 309 positioned at edge sections of the slit pattern region have growth rates, which may vary depending on a crystallization direction thereof. In addition, the grains are grown while competing with each other so that grains 307 having a relatively large size are primarily formed. Such a grain competition may occur in an early stage of grain growth, while forming a micro grain area having a plurality of grains. In FIG. 4a, reference numeral 306 represents the micro grain area, and reference numeral Lg1 represents a lateral growth length of the grains, respectively.

Figure 3B:
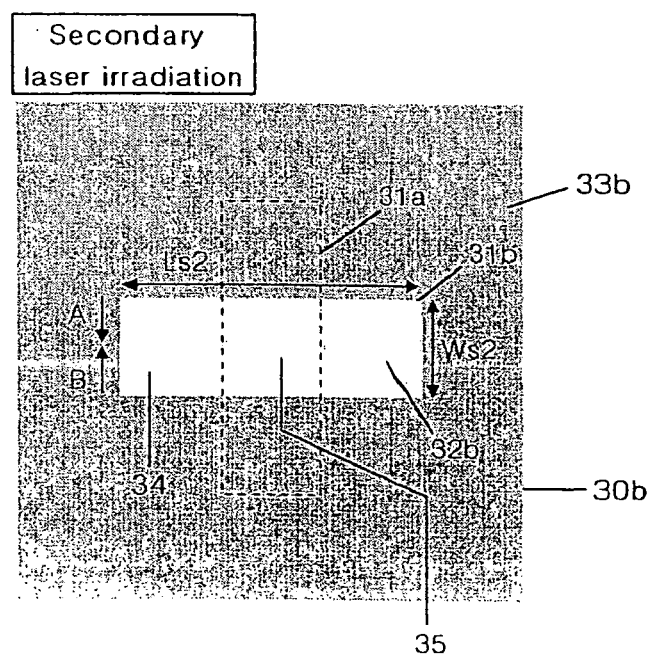

FIG. 3b is a view showing a laser pattern obtained through the secondary laser irradiation. As shown in FIG. 3b, a slit pattern region 31b formed in a mask pattern 30b has a shape similar to a shape of the slit pattern region 31a obtained through the primary laser irradiation. However, the slit pattern region 31b is aligned perpendicularly to the slit pattern region 31a. The slit pattern region 31b has predetermined width Ws2 and length Ls2. The secondary laser irradiation may be carried out with predetermined energy capable of melting an a-Si film formed in an open area 32b, except for an a-Si film formed in a masking area 33b of the mask pattern 30b.

Herein, in the same manner as the primary laser irradiation, the grains may grow in A and B directions from edge sections of the slit pattern region 31b. In addition, the grains make contact with each other at a center of the slit pattern region 31b, thereby finishing a crystallization process.

However, the open area 32b obtained through the secondary laser irradiation may be divided into an a-Si region 34 and an overlapped region 35, which has been already crystallized through the primary laser irradiation. In the same manner as the primary laser irradiation, the a-Si region 34 is crystallized through the lateral growth of the grains, which are formed in edge sections of the slit pattern region 31b due to nucleation generated from the edge section of the slit pattern region 31b. However, edge sections of the overlapped region 35 may consist of poly-Si other than a-Si, so the crystallization process in the overlapped region 35 must be carried out by growing the grains into melted Si while using poly-Si as a seed.

In detail, FIG. 4b shows various statuses of the overlapped region 35 until the overlapped region 35 has been crystallized after the secondary laser irradiation is carried out.

Referring to a first figure provided in an uppermost part of FIG. 4b, a secondary laser irradiation area 320 includes a poly-Si region 324 which has already been melted through the primary laser irradiation, and an a-Si region 321 which has been melted through the secondary laser irradiation. At this time, a boundary is formed between a melted region and a non-melted region. In the overlapped region, parts of the poly-Si grains formed through the primary laser irradiation may not be melted, but act as seed grains 323a, 323b, 323c and 323d.

A second figure provided in a middle part of FIG. 4b shows grains growing into a melted-Si section 339 after the laser has been irradiated. Similar to grains in the primary laser irradiation, grains 334, 335, 336, 337 and 337a formed in the a-Si area are grown from crystal nuclei 338 formed in edge sections of the slit pattern region. However, grains existing in the overlapped region are grown from poly-Si seed grains 325 to 328 so that grains are grown into the melted-Si section 339. That is, not only grains 3251 to 3281, which are grown from poly-Si seed grains 325 to 328 after the primary laser irradiation has been carried out, but also grains 330 to 333 grown from micro grains 306 and 333b (referred to FIG. 3b and FIG. 4b) formed adjacent to edge sections of a crystallization region may exist in the overlapped region. While the crystallization process is being carried out after the secondary laser irradiation, a seed effect may outstandingly occur if the length of the grains formed through the primary laser irradiation becomes enlarged. However, the micro grains formed through the primary laser irradiation have short lengths, so the grains 330 to 333 grown from micro grains 306 and 333b formed adjacent to edge sections of the crystallization region do not exert great effect.

A third figure provided in a lowest part of FIG. 4b shows grains, which have been crystallized after the secondary laser irradiation. When the secondary laser irradiation has been carried out, the overlapped region includes grains 3252 to 3282, which are grown with long sizes through the primary laser irradiation, and grains 3301 to 3331 grown from a micro grain region after the primary laser irradiation has been carried out. In addition, grains 3341 to 3371, which represent a microstructure after they are crystallized by receiving laser through the slit pattern, are formed around the overlapped region. At this time, the grains, which are formed in the overlapped region after the secondary laser irradiation has been carried out, have large sizes, which may not be achieved through the conventional two-shot SLS process. The grains formed in the overlapped region with large sizes are used as seed grains when the third laser irradiation is carried out.

Figure 3C:
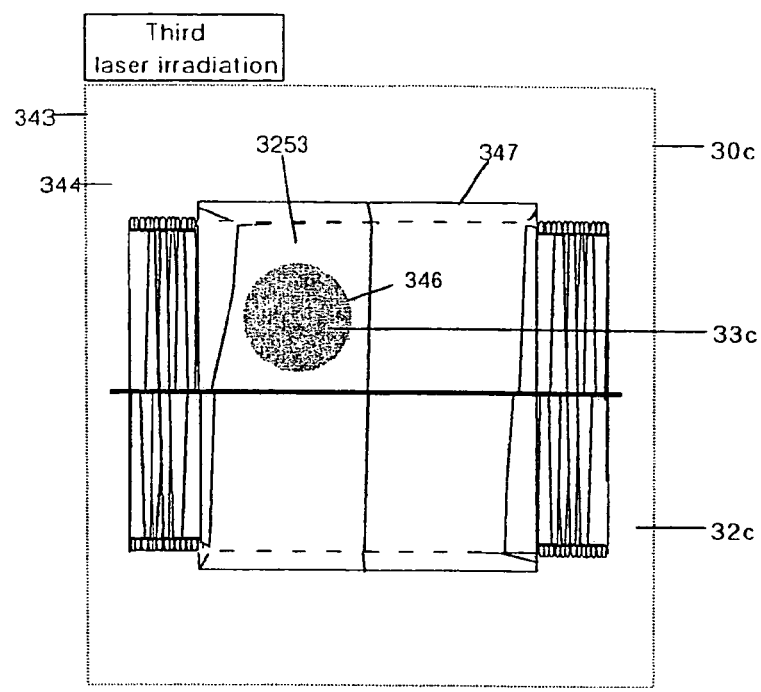

FIG. 3c is a view showing an alignment of a mask pattern and a crystallization process when the third laser irradiation is carried out. As shown in FIG. 3c, a mask pattern 30c consists of a masking area 33c for covering a predetermined region and an open area 32c. In order to carry out the third laser irradiation, a grain 3253 is selected from grains, which are formed in the overlapped region with large sizes after the secondary laser irradiation has been carried out. Then, the masking area 33c is aligned on the selected grain 3253. At this time, the size of the masking area 33c identical to or smaller than a size of the seed grain. In addition, the masking area 33c can be formed in various shapes, such as a circular shape or a polygonal shape.

The third laser irradiation is carried out with predetermined laser energy sufficient for melting the open area 32c, except for the masking area 33c. As a result, the whole area including a poly-Si region, which is formed after the secondary laser irradiation has been carried out, is melted. Of course, Si-grains formed in the masking area 33c are not melted. The grains are grown into the Si area by utilizing the Si-grains formed in the masking area 33c as seed grains. The grains may continuously grow until melted-Si makes contact with grains formed through a spontaneous nucleation while melted-Si is being cooled. Finally, as shown in FIG. 4c, the size of the grain is double as compared with a sum of a seed grain size and a growth length Lg3 of the grain grown from a boundary 3461 (referred to FIG. 4c) between the seed grain and liquid-phase Si.

Figure 4C:
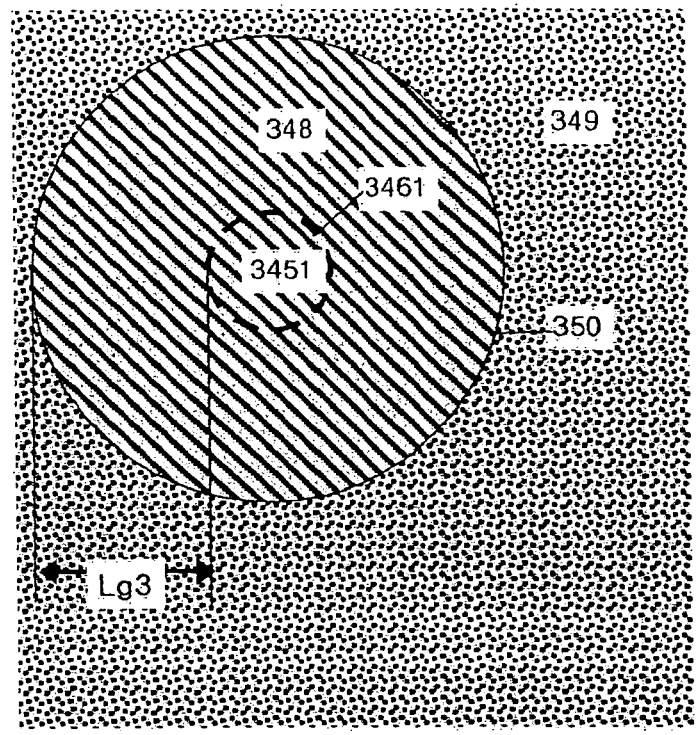

FIG. 4c is a schematic view showing an amorphous Si-film has been crystallized after the third laser irradiation has been carried out. As shown in FIG. 4c, a poly-Si region 349, which is formed from a melted region through spontaneous nucleation and grain growth, is positioned adjacent to an original seed region 3451 and a newly grown region 348 while forming a boundary 350 therebetween. Grains formed in the poly-Si region 349 are obtained through spontaneous nucleation, so sizes of the grains may be small. Herein, since the third laser irradiation is carried out by selecting one of Si grains, which are obtained through the secondary laser irradiation, as a seed grain, it is possible to form a single crystalline Si film during the third laser irradiation.

Therefore, according to the present invention, the single crystalline Si film having a predetermined size can be grown at a predetermined portion of an a-Si film by radiating laser onto the a-Si film through the slit pattern. For instance, a Si active layer for forming a TFT can be achieved by performing primary to third laser irradiation processes with respect to a TFT forming area and etching a single crystalline Si region, which is achieved through the primary to third laser irradiation processes, in a predetermined form.

Figure 3D:
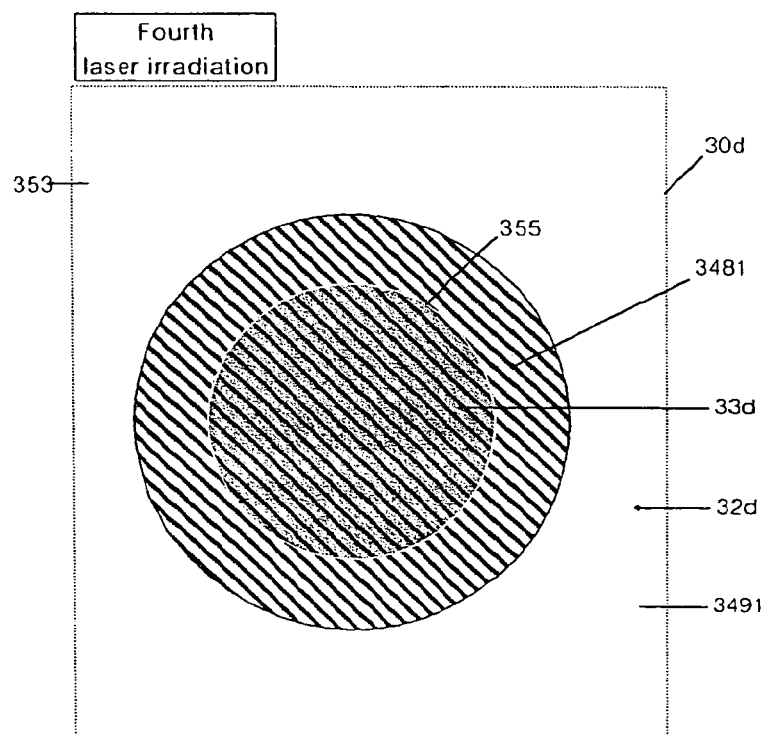

Meanwhile, if it is necessary to enlarge the size of the single crystalline Si film, as shown in FIG. 3d, fourth laser irradiation is carried out by using a mask pattern 30d having a masking area 33d, which is identical to or smaller than the single crystalline Si region formed through the third laser irradiation. At this time, the size of the masking area 33d must be larger than the size of the masking region 33c used in the third laser irradiation in order to enlarge the single crystalline Si region.

Figure 4D:
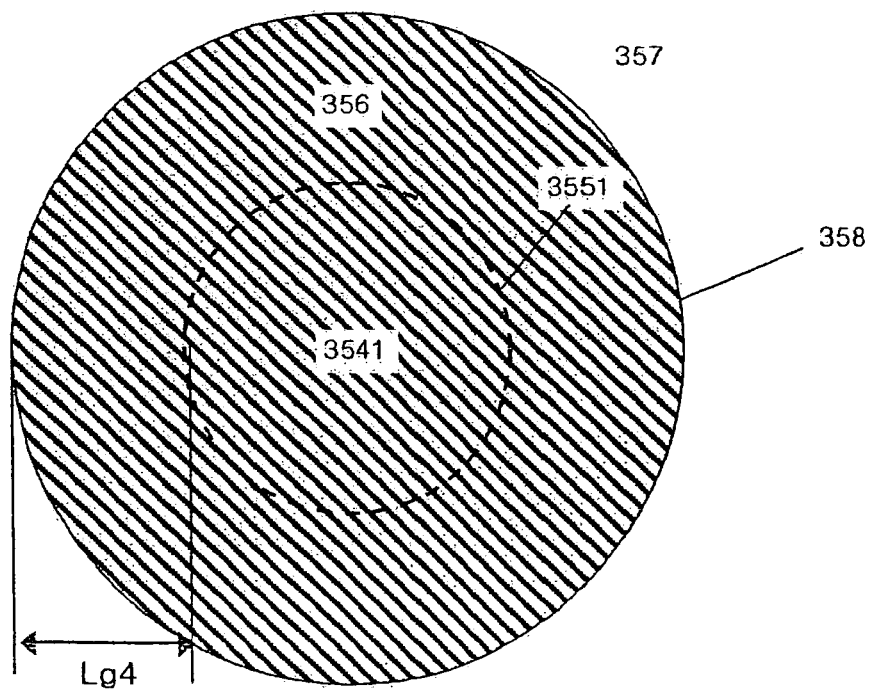

In this case, a part 3481 of the single crystalline Si region and the poly-Si region 3491, which are an open area 32d formed through the third laser irradiation, except for a Si region of the masking area 33d are melted. In addition, as shown in FIG. 4d, grains are laterally grown from a boundary 3551 between the melted region and the single crystalline Si region by a predetermined length Lg 4.

In the same manner as the third laser irradiation, a poly-Si region 357 consisting of small grains derived from spontaneous nucleation is formed in the melted Si region. In addition, grains existing in the poly-Si region may make contact with grains grown from the seed grain 3541, thereby determining the size of the single crystalline Si region formed by the fourth laser irradiation.

After the fourth laser irradiation has been carried out, if the above processes are repeatedly carried out while enlarging the size or the shape of the masking area, various kinds of single crystalline Si may be formed. In addition, as mentioned above, an active layer pattern of the TFT can be achieved by etching such single crystalline Si into a required shape. The position of single crystalline Si can be adjusted by controlling a position of the mask or the stage on which the substrate is placed.

Consequently, according to the crystallization method of the present invention, the single crystalline Si film can be formed on a predetermined portion of the a-Si film without crystallizing the whole area of the a-Si film, so that the TFT characteristics for a pixel section and a peripheral circuit may be improved with superior uniformity.

Figure 5A:
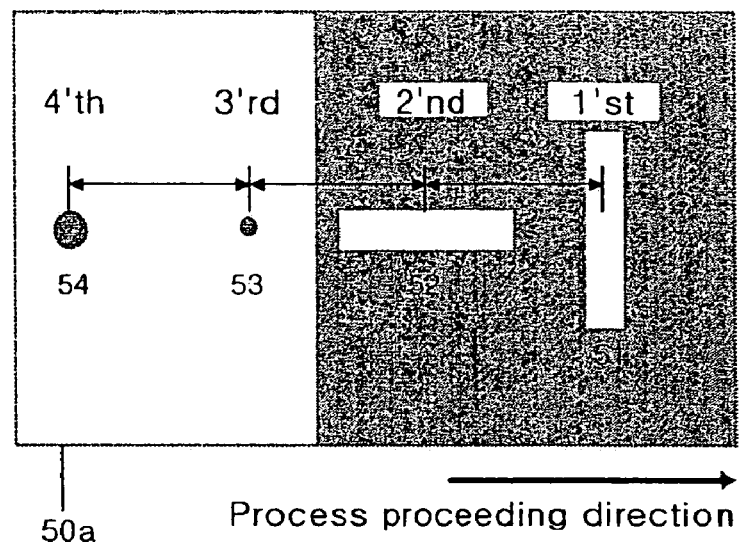
FIGS. 5a and 5b are views showing masks used in a method for crystallizing an amorphous silicon film according to one embodiment of the present invention.
Figure 5B:
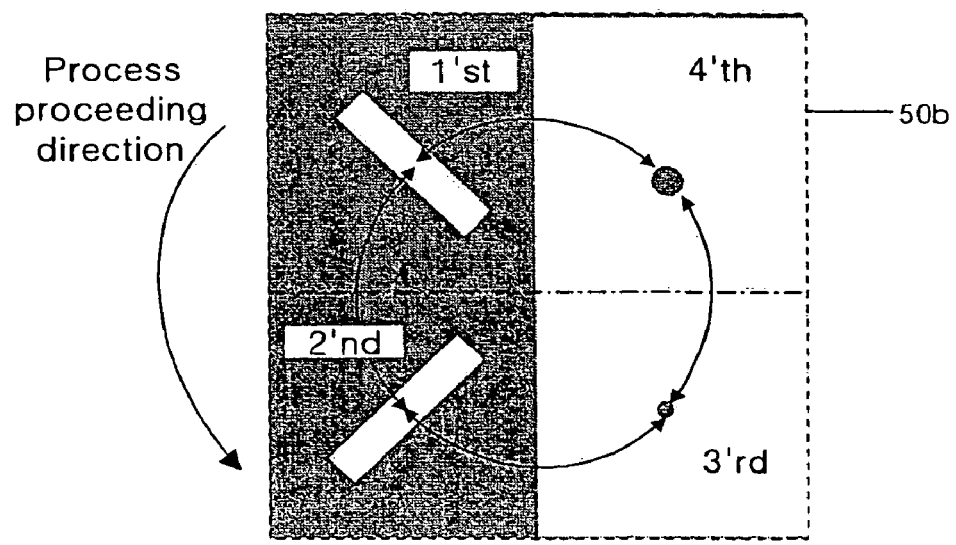

FIGS. 5a and 5b show masks used for performing primary to fourth laser irradiation processes.

Laser beam is converted into a predetermined layer pattern by passing through masks 50a and 50B. In addition, the laser beam may be formed with a reduced scale through an optical system such that the laser beam is radiated only onto a crystallization region, if necessary. Although it is possible to use a new mask whenever one shot is carried out, it is preferred to perform the irradiation process by moving the substrate or the mask after forming various open areas corresponding to irradiation regions in one mask in order to increase productivity and preciseness for the irradiation process.

The laser beam can be sequentially irradiated onto the substrate while moving the substrate in one direction or X or Y direction. In addition, the laser beam can be sequentially irradiated onto the substrate while rotating the substrate or the mask.

FIG. 5a shows a mask 50a used for irradiating the laser beam onto the substrate. The mask 50a may be fixed during the laser irradiation process while the substrate is being moved from a right to a left, or may be moved from a right to a left while the substrate is being fixed. The mask 50a has various patterns 51 to 55 used for primary to fourth laser irradiation processes. After the primary laser irradiation has been carried out, the secondary laser irradiation is carried out while moving the mask 50a by a predetermined distance in match with a crystallization position. In addition, third and fourth laser radiation processes are carried out while further moving the mask 50a.

FIG. 5b shows a mask 50b used for irradiating the laser beam onto the substrate while rotating the mask 50b or the stage on which the substrate is placed.

Figure 6A:
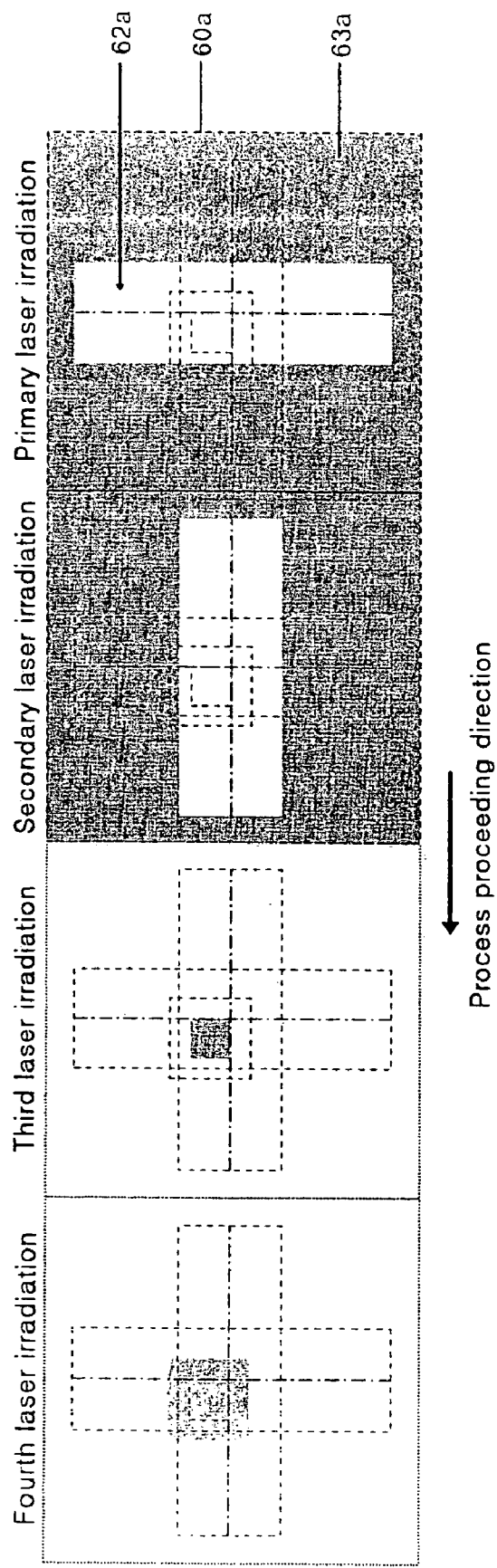
FIGS. 6a to 6c are views for explaining a method for crystallizing an amorphous silicon film according to another embodiment of the present invention.

According to another embodiment of the present invention, a mask 60a as shown in FIG. 6a can be used so as to selectively crystallize the a-Si film. In order to represent irradiation positions of the a-Si film in each irradiation process, patterns formed on the a-Si film through the primary to fourth irradiation processes are shown as dotted lines and overlapped with each other.

As shown in FIG. 6a, the mask 60a includes a masking area 63a blocking the laser beam and an open area 62 allowing the laser beam to pass therethrough. The internal structure of the mask 60a is substantially identical to that of the above-mentioned masks. The masking area has a rectangular shape when the third and fourth laser irradiation processes are carried out. In addition, when the third laser irradiation process is carried out by using seed grains, which are created from an overlapped region after the primary and secondary laser irradiation processes have been carried out, the masking area is precisely aligned on a cross portion of slits used for the primary and secondary laser irradiation processes.

As mentioned above, the laser beam passing through the patterns formed in the mask 60a is radiated onto a test sample to be crystallized through an optical system, such as a projection lens. At this time, the patterns formed on the test sample have a reduced scale about ⅕ of the patterns formed in the mask 60a.

In order to prevent unnecessary grains from being created in edge sections of the overlapped region, total six laser irradiation processes have been carried out by designing the mask in such a manner that the primary and secondary laser irradiation processes may be added once more. In addition, it is also possible to carry out total five laser irradiation processes by additionally performing one of the primary and secondary laser irradiation processes once more.

Figure 6B:
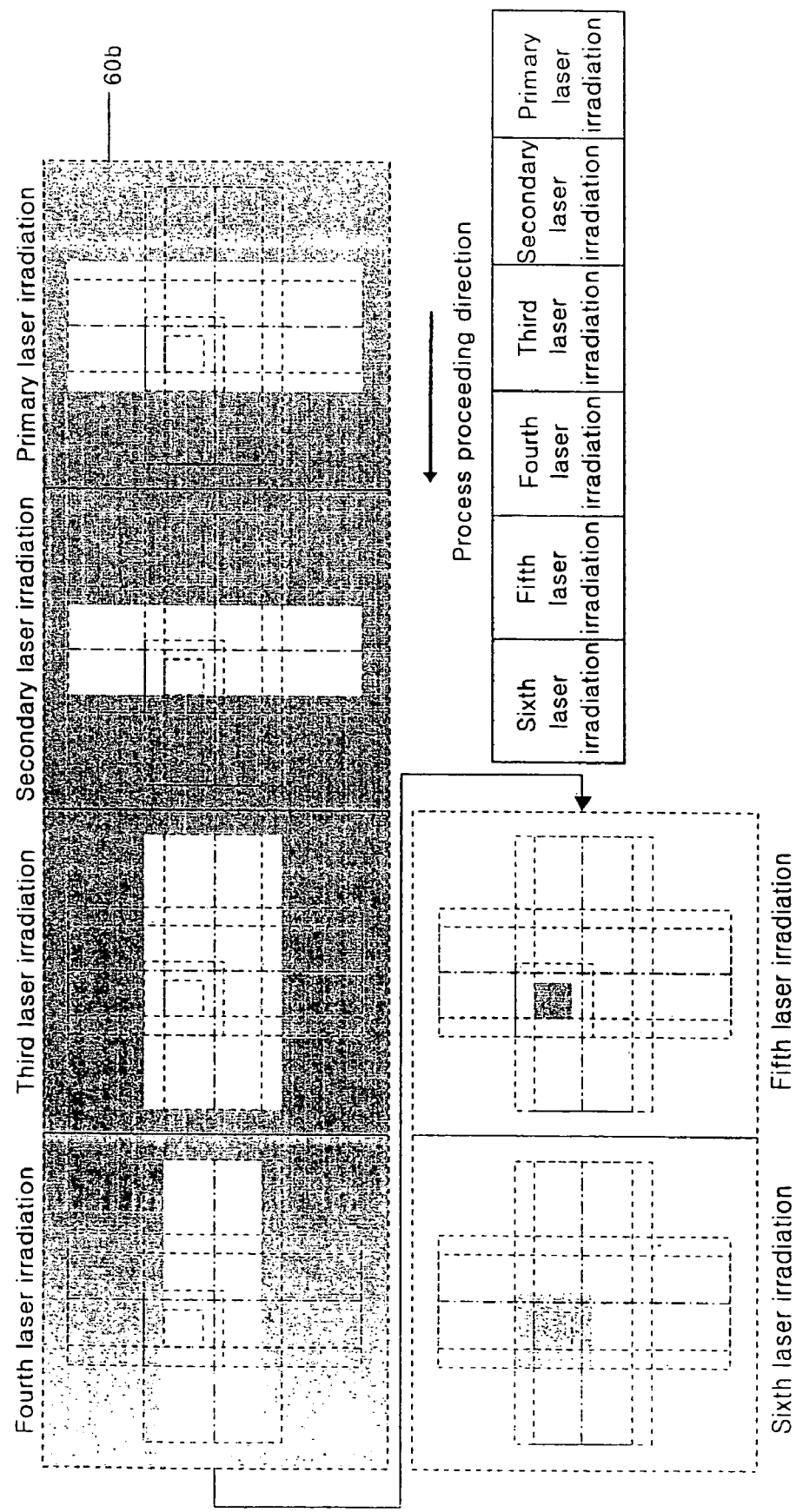

FIG. 6b is a view for explaining a method for crystallizing the a-Si film according to another embodiment of the present invention. As shown in FIG. 6b, a mask 60b used in the present embodiment has a masking area 63b and an open area 62b, which are similar to those of the mask 60a shown in FIG. 6a. In addition, according to the present embodiment, primary and third laser irradiation processes are carried out with slit patterns having a width larger than a width of the patterns used in the primary and secondary laser irradiation processes of FIG. 6a. Thus, since the silt patterns have a wider width, grains grown from the edge sections of the slit patterns with a long length and a poly-Si region formed at center portions of the slit patterns due to spontaneous nucleation may exist. In addition, secondary and fourth laser irradiation processes are carried out so as to melt the whole area of the poly-Si region and parts of the grains, which have been laterally grown from the edge sections through the primary and third laser irradiation processes. That is, the grains, which are laterally grown after the primary laser irradiation process has been carded out, may further grow through the secondary laser irradiation process so that they make contact with each other at the center portions of the slit patterns. Furthermore, the grains may further grow through the third laser irradiation process.

In addition, according to the present embodiment, an amount of the unnecessary micro grains formed in the edge sections of the overlapped region can be reduced as compared with the embodiment shown in FIG. 6a. This is because the grains formed in the edge sections of the overlapped region after the fourth laser irradiation process has been carried out have a size larger than a size of the grains formed in the overlapped region after the secondary laser irradiation process has been carried out by using the mask shown in FIG. 6a. Accordingly, when a fifth laser irradiation process is carried out in order to form a single crystalline Si pattern by selecting a large-sized grain from the grains formed in the overlapped region, a margin for aligning the irradiation position may increase. Therefore, the masking pattern is positioned more distant from the edge sections of the overlapped region when the fifth laser irradiation process is carried out, so the single crystalline Si pattern can be easily achieved.

In the same way, a sixth laser irradiation process can be carried out in order to further enlarge the size of the single crystalline Si pattern formed through the fifth laser irradiation process. It is possible to use a large-sized slit only one time during the primary or third laser irradiation process and an order of the primary to fourth laser irradiation processes can be varied, if necessary.

As a result, according to the present embodiment, when the primary and secondary laser irradiation processes are carried out by using slit patterns which are aligned in cross with each other, an amount of the unnecessary micro grains formed around the overlapped region can be reduced, so that the single crystalline Si film may be precisely formed.

Meanwhile, although the primary and third laser irradiation processes are carried out by using the mask identical to the mask used for the primary and secondary laser irradiation processes shown in FIG. 6a, the secondary and fourth laser irradiation processes can be performed by using a mask formed with slit patterns having a size identical to or smaller than a size of the slit patterns formed in the mask used for the primary and third laser irradiation processes. In this case, the crystallization is achieved through the above-mentioned processes.

Figure 6C:
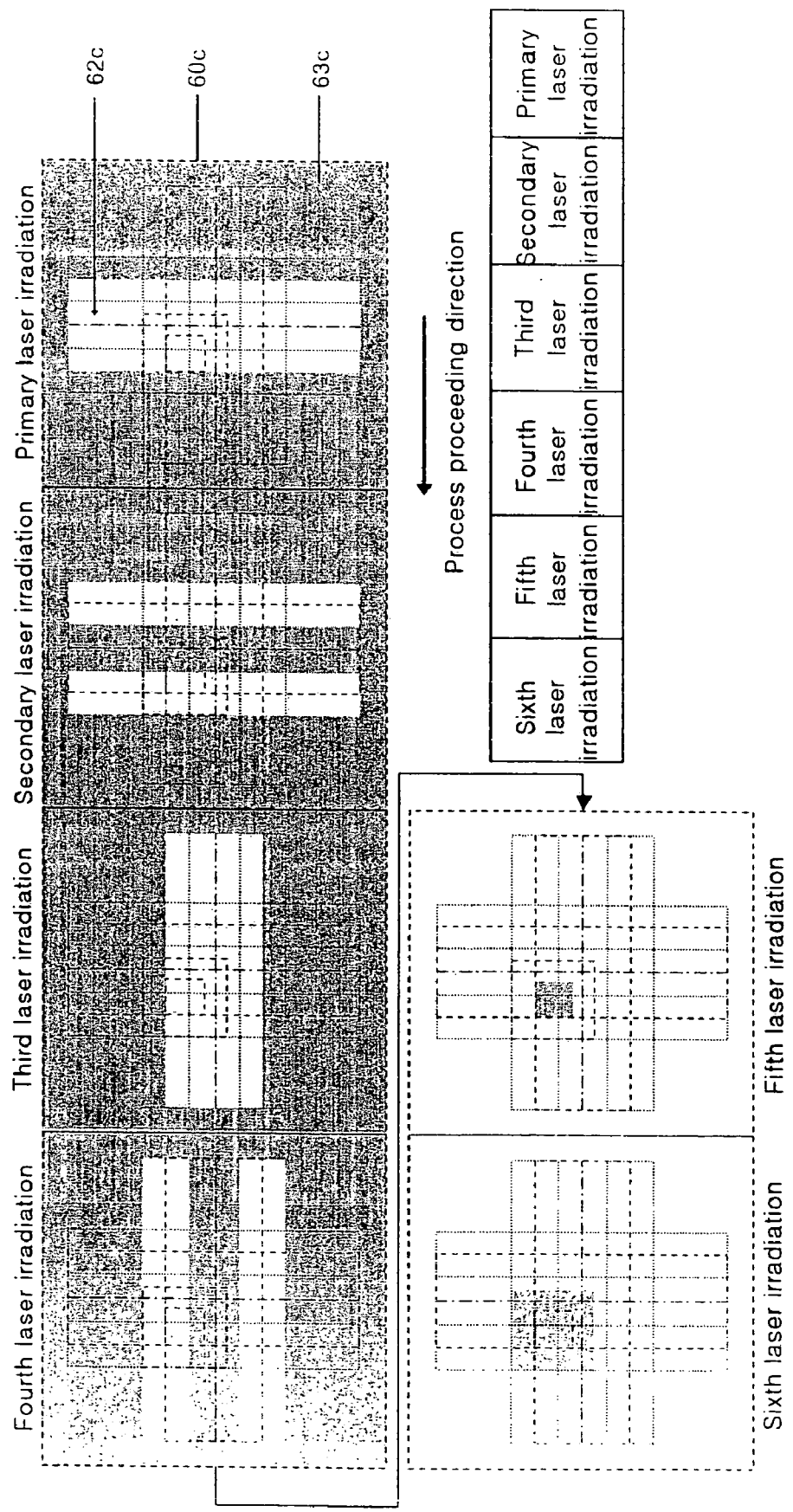

According to still another embodiment of the present invention, a mask as shown in FIG. 6c can be used for irradiating the laser beam onto the a-Si film. According to the present embodiment, micro grains formed in the edge sections of the slit patterns after the primary laser irradiation process has been carried out may be removed through the secondary laser irradiation process. At the same time, the grains having lengths extending to a protrusion section may be further lengthened. For this reason, the single crystalline Si region can be easily achieved after the third laser irradiation process has been carried out. Furthermore, even if the unnecessary micro grains are formed in the edge sections through the third laser irradiation process, they are removed through the fourth laser irradiation process while further enlarging the single crystalline Si region formed through the third laser irradiation process. In this way, the single crystalline Si pattern can be easily achieved with large size through next fifth and sixth laser irradiation processes.

The present embodiment is one of methods for precisely forming the single crystalline Si pattern, in which only one part of slit patterns may be used during the secondary or fourth laser irradiation process. In addition, it is also possible to carry out the fifth and sixth laser irradiation processes after the primary to fourth laser irradiation processes have been repeatedly carried out. Since the amount of the unnecessary grains formed in the edge sections of the slit patterns through the primary laser irradiation process can be reduced, the single crystalline Si pattern can be more easily achieved.

Although the above-mentioned embodiments show that the slit pattern of the mask used for the secondary laser irradiation process is aligned in cross with the slit pattern of the mask used for the primary laser irradiation process, the slit patterns may be aligned with each other at a predetermined angle other than a right angle.

As described above, the method of the present invention can form the single crystalline Si film having a desired size on a predetermined position of the a-Si film formed on an amorphous substrate, such as a glass substrate or a plastic substrate. Thus, it is possible to fabricate a high-performance TFT adapted for an SOG structure while significantly improving uniformity of the single crystalline Si film.

In addition, since the a-Si film can be selectively or locally crystallized, the manufacturing time and manufacturing cost required for the single crystalline Si film may be reduced.

Furthermore, a device employing the single crystalline Si film matches with not only peripheral circuits having a low switching speed, but also peripheral circuit having a high speed, so the present invention can be advantageously used for designing high quality articles.

In addition, since a plurality of peripheral circuit parts can be integrated on a substrate due to the high-performance TFT, a cost for module parts can be saved as compared with articles employing the a-Si film or the poly-Si film.

Moreover, since the single crystalline Si film may lower a shift of threshold voltage as a function of operational time as compared with the poly-Si film, the method of the present invention is very advantageous for manufacturing the organic light emitting display, which is a current-drive type display device requiring high reliability and uniformity of device characteristics, while reducing power consumption of the articles.

In addition, the present invention can form the single crystalline Si film not only on the glass substrate, but also on a small substrate, such as a Si wafer, so that the method of the present invention can be applicable for a semiconductor memory integration process, such as an SOI (silicon-on-insulator) manufacturing process or a three-dimensional IC manufacturing process.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

What is claimed is:

1. A method for crystallizing an amorphous silicon film formed on an amorphous substrate in order to fabricate a liquid crystal display by irradiating a laser beam onto the amorphous silicon film from a laser source, the method comprising the steps of:
   i) in a first laser irradiation process, selectively irradiating the laser beam onto a region of the amorphous silicon film through a first mask having a slit-shaped opening so that a primary, slit-shaped area of amorphous silicon film is melted by said laser beam;
   ii) in a second laser irradiation process, selectively irradiating silicon by a laser beam through a second mask having a slit-shaped opening that is at a predetermined angle relative to the slit in said first mask so as to melt at least some of the silicon melted during said first laser irradiation process so that when silicon melted in said second laser irradiation process solidifies, it forms a plurality of silicon crystal grains, and
   ii) in a third laser irradiation process, irradiating the laser beam onto one of grains formed in the poly-silicon film through a third mask, thereby forming a single crystalline silicon region having a desired size on a predetermined portion of the amorphous silicon film.

2. The method as claimed in claim 1, wherein the laser source is one selected from the group consisting of an excimer laser, a solid-state laser, a halogen lamp and a CW laser.

3. The method as claimed in claim 1, wherein the first, second and third laser irradiation processes are carried out by using a mask including a slit pattern having a predetermined shape for locally irradiating the laser beam onto a predetermined part of the amorphous silicon film and an optical system for irradiating the laser beam with a reduced scale.

4. The method as claimed in claim 3, wherein the primary laser irradiation process is carried out by irradiating the laser beam onto the amorphous silicon film through the slit pattern of the mask, the secondary laser irradiation process is carried out by moving at least one of the substrate the mask, and the third laser irradiation process is carried out by further moving at least one of the substrate and the mask by a predetermined distance, thereby forming a single crystalline silicon region.

5. The method as claimed in claim 4, wherein the third laser irradiation process is selectively carried out with respect to one of grains formed in an overlapped region after the first and second laser irradiation processes have been carried out.

6. The method as claimed in claim 4, wherein the third laser irradiation process is carried out by using a mask capable of forming a masking area having a size identical to or smaller than a size of a seed grain on the seed grain.

7. The method as claimed in claim 4, further comprising a step of performing a fourth laser irradiation process after the third laser irradiation process has been carried out in order to enlarge a size of the single crystalline silicon region formed through the third laser irradiation process.

8. The method as claimed in claim 3, wherein a mask used for the first and second laser irradiation processes has slit patterns aligned while forming a predetermined angle therebetween, and a mask used for the third laser irradiation process has a circular shaped or a polygonal shaped masking area having a size identical to or smaller than a size of a seed grain.

9. The method as claimed in claim 3 or 8, wherein the mask used for the first and second laser irradiation processes has slit patterns aligned perpendicularly to each other.

10. The method as claimed in claim 8, wherein the fourth laser irradiation process is carried out by using a mask including a circular shaped or a polygonal shaped masking area having a size identical to or smaller than a size of a single crystalline silicon region formed through the third laser irradiation process.

11. The method as claimed in claim 8, further comprising a step of additionally performing a laser irradiation process between the first and second laser irradiation processes and between second and third laser irradiation processes by using a mask including a silt pattern having a size identical to or narrower than a size of the slit pattern used for the primary and secondary laser irradiation processes.

12. The method as claimed in claim 1, further comprising a step of additionally performing a laser irradiation process between the first and second laser irradiation processes and between second and third laser irradiation processes by using a mask including a pair of slit patterns for irradiating the laser beam onto each of both edge sections of the slit pattern used for the first and second laser irradiation processes.

* * * * *